(12) United States Patent
Jaussi et al.

(10) Patent No.: US 8,249,137 B2
(45) Date of Patent: Aug. 21, 2012

(54) IN-SITU JITTER TOLERANCE TESTING FOR SERIAL INPUT OUTPUT

(75) Inventors: James E. Jaussi, Hillsboro, OR (US);
Bryan K. Casper, Portland, OR (US);
Stephen R. Mooney, Mapleton, UT (US)

(73) Assignee: Intel Corporation, Santa Clara, CA (US)

( * ) Notice: Subject to any disclaimer, the term of this patent is extended or adjusted under 35 U.S.C. 154(b) by 1101 days.

(21) Appl. No.: 12/139,835

(22) Filed: Jun. 16, 2008

(65) Prior Publication Data

US 2009/0310728 A1    Dec. 17, 2009

(51) Int. Cl.
*H04B 3/46*    (2006.01)
*H04L 7/00*    (2006.01)

(52) U.S. Cl. ........................ 375/226; 375/371

(58) Field of Classification Search .......... 375/224, 375/226–228, 371, 373–376; 327/100–103, 327/110, 129, 132; 714/700, 704, 814
See application file for complete search history.

(56) References Cited

U.S. PATENT DOCUMENTS

| | | | |
|---|---|---|---|
| 5,835,501 A * | 11/1998 | Dalmia et al. | 714/704 |
| 6,922,097 B2 * | 7/2005 | Chan et al. | 327/536 |
| 7,743,288 B1 * | 6/2010 | Wang | 714/704 |
| 7,853,836 B2 * | 12/2010 | Takada | 714/700 |
| 2008/0022143 A1 * | 1/2008 | Scouten et al. | 713/400 |
| 2008/0056339 A1 * | 3/2008 | Hsiao et al. | 375/224 |
| 2008/0143396 A1 * | 6/2008 | Nishida | 327/146 |
| 2009/0086801 A1 * | 4/2009 | Liu et al. | 375/224 |
| 2010/0026314 A1 * | 2/2010 | Schuttert | 324/555 |

OTHER PUBLICATIONS

Jaussi et al., In-Situ Tolerance Measurement Technique for Serial I/O, 2008, VLSI Circuits, 2008 IEEE Symposium on, pp. 168-169.*
Kim et al., Analysis and Simulation of Jitter for High Speed Channels in VLSI Systems, 2007, Instrumentation and Measurement Technolgy Confernece Proceedings, 2007. IMTC 2007. IEEE, pp. 1-4.*
Jaussi et al., In-situ jitter tolerance measurement device for Serial I/O, 2008, VLSI Circuits, 2008 IEEE Symposium on, pp. 168-169.*

* cited by examiner

*Primary Examiner* — Lawrence B Williams
(74) *Attorney, Agent, or Firm* — Schwabe, Williamson & Wyatt, P.C.

(57) ABSTRACT

According to some embodiments, a method and apparatus are provided to generate a sine wave via a jitter modulator to modulate a control voltage of a clock source. The jitter modulator is in-situ on a die. The sine wave is received at a clock and data recovery circuit comprising the clock source. The clock and data recovery circuit is in-situ on the die.

15 Claims, 4 Drawing Sheets

400

Generate a sine wave via a jitter modulator to be injected into a clock source, the jitter modulator being in situ on a die
401

Receive the sine wave at a clock and data recovery circuit comprising the clock source, the clock and data recovery circuit being in-situ on the die
402

500

| Receiving data from a transmitter at a receiver comprising a jitter modulator and a CDR, the data comprising a clock signal | 501 |

↓

| Generating an error via the jitter modulator, wherein the error comprises a modulated sequence added to an output of the clock and data recover circuit | 502 |

↓

| Injecting the error into the clock and data recover circuit | 503 |

↓

| Repressing the error at the clock and data recover circuit based on detecting a change in an input edge, wherein repressing comprises changing a phase of a clock source contained in the clock and data recover circuit | 504 |

↓

| Outputting a clock signal comprising the repressed error | 505 |

↓

| Determining an error tolerance by subtracting the received data from the outputted clock signal | 506 |

FIG. 5

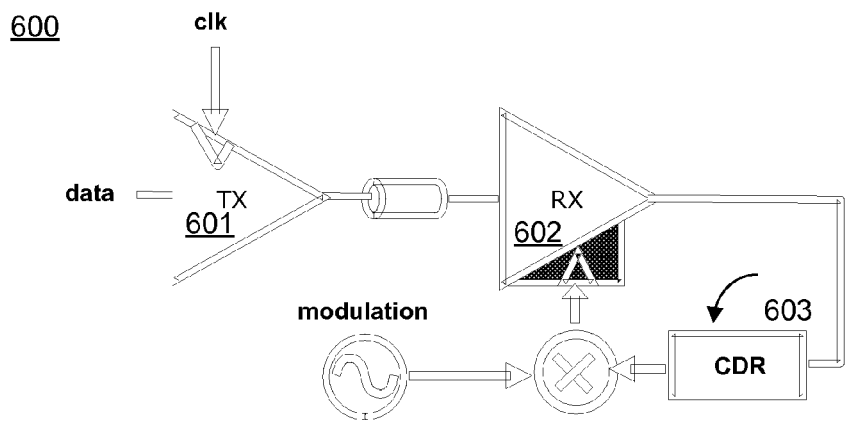

FIG. 6

IN-SITU JITTER TOLERANCE TESTING FOR SERIAL INPUT OUTPUT

BACKGROUND

Data streams that transmitted between communication systems often include both a data portion and a clock signal. At a receiving system, the data portion is extracted (i.e., recovered) from the data stream and the clock signal is also extracted from the data stream. The circuit that performs these extractions is called a clock and data recovery circuit ("CDR").

A CDR may be susceptible to jitter (i.e., noise) and, as Input/Output ("I/O") rates scale beyond several gigabits per second, the use of external test equipment to accurately characterize and quantify link operating margins (i.e., a CDR's ability to distinguish between data and jitter) becomes increasingly difficult. FIG. 1 illustrates a conventional test bench for testing a CDR 103. The test bench comprises external test equipment, such as a pattern generator 101 and a modulation source 102, which are expensive to purchase. As illustrated, the CDR 103 may be a component of a circuit package 104, and the circuit package 104 may be coupled to a circuit board 105. While testing jitter tolerance through external test equipment is useful, and currently required by industry specifications, it is not always an effective measure of the CDR's 103 performance because external test equipment may not accurately reflect internal components of a system being tested.

BRIEF DESCRIPTION OF THE DRAWINGS

FIG. 5 illustrates a process according to some embodiments.

FIG. 6 illustrates a system according to some embodiments.

DETAILED DESCRIPTION

Figure 1:
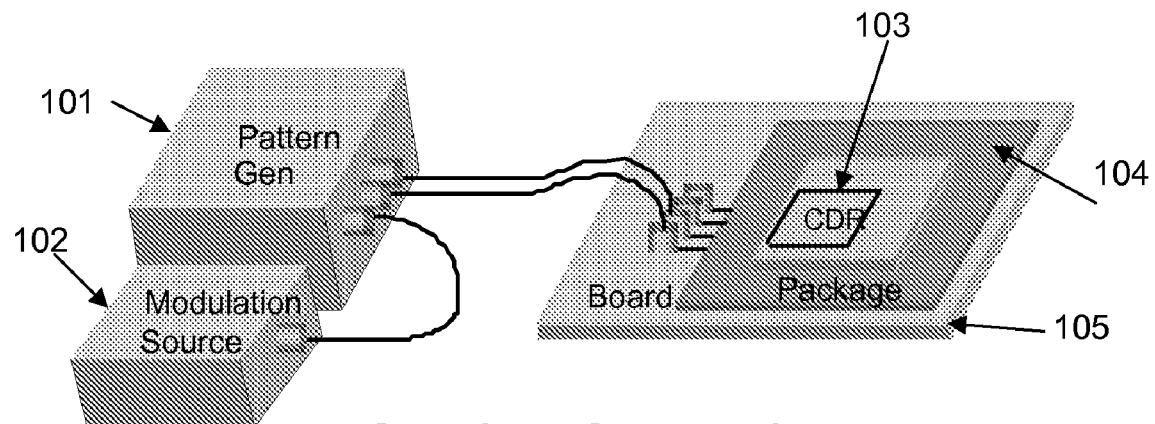
FIG. 1 illustrates a conventional test bench.
Figure 2:
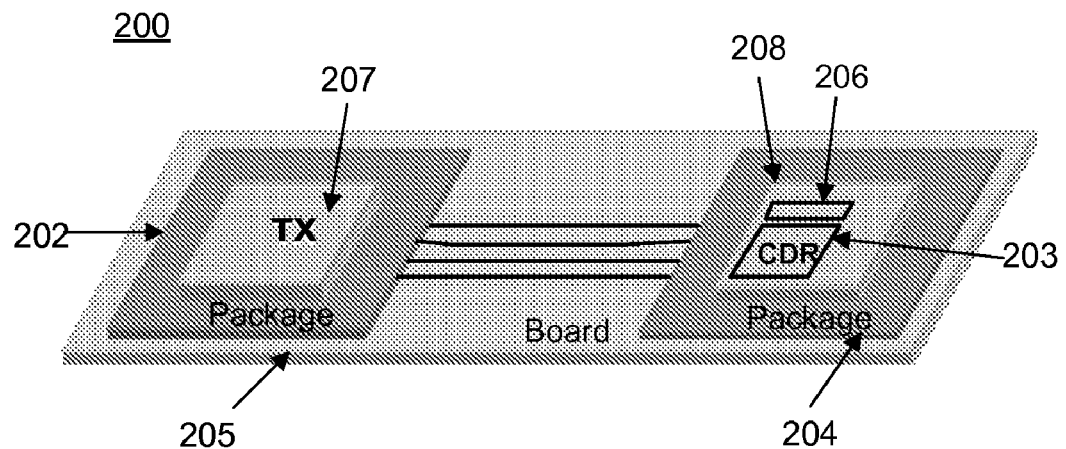
FIG. 2 illustrates a system according to some embodiments.

Referring now to FIG. 2, an embodiment of a system 200 is shown. System 200 may illustrate in-situ jitter tolerance testing of an I/O system that comprises a CDR 203. In-situ jitter tolerance testing may determine a CDR's 203 tolerance to jitter in a realistic environment and may provide characterization of an entire I/O system. Furthermore, in-situ jitter tolerance testing may provide in-the-field system diagnostic testing capabilities because unlike the prior art that requires use of a test board, an external pattern generator, and an external test receiver, in-situ jitter tolerance testing allows an actual transmitter, an actual board, and an actual receiver to be used during testing in the field. Moreover, while in-the-field, a system can be tested and/or calibrated for margining where a margin may be an amount of jitter that can be injected into the system before the system demonstrates a failure.

System 200 may comprise a circuit board 205 coupled to a first circuit package 202 and a second circuit package 204. Each circuit package 202/204 may comprise a circuit die 207/208. In some embodiments, the first circuit package 202 and the second circuit package 204 may comprise a single circuit package that comprises a single circuit die.

On-die jitter tolerance testing may be accomplished by introducing sinusoidal jitter (i.e., an error) into the CDR 203 from an on-die jitter modulator 206, where the sinusoidal jitter may result from a modulation of a control voltage of a clock source, such as, but not limited to, an inductor/capacitor ("LC")-based voltage controlled oscillator ("VCO") of the CDR 203. Jitter amplitudes and frequencies generated within the CDR 203 may be varied by manipulating the LC-VCO control voltage.

The on-die sinusoidal jitter modulator 206 may be programmable in both amplitude and frequency. The frequency range of the jitter may be set to characterize jitter tolerance above and below a CDR 203 loop bandwidth. In some embodiments, circuit die 207 may comprise a transmitter to output sinusoidal jitter associated with circuit die 208 to a monitoring device (not shown).

Figure 3:
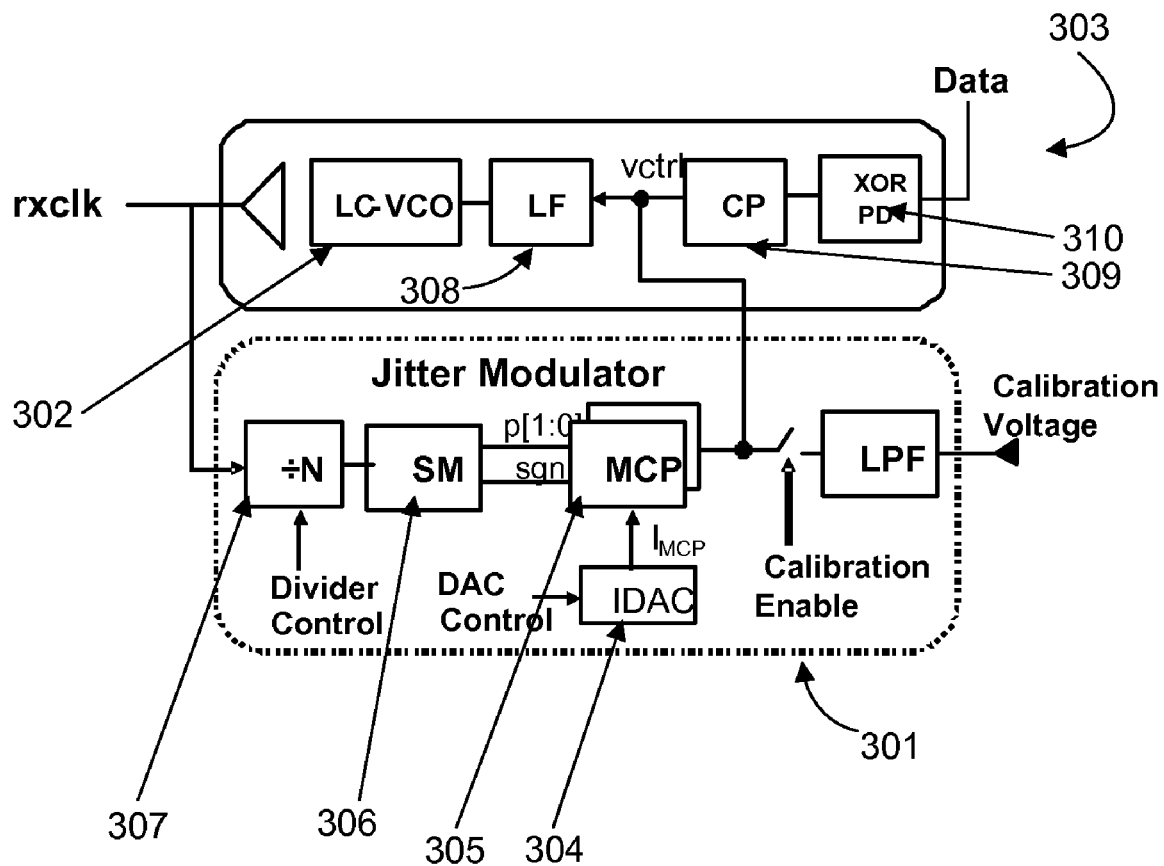
FIG. 3 illustrates an apparatus according to some embodiments.

FIG. 3 may illustrate an embodiment of a CDR circuit 303 and a jitter modulator 301. The CDR circuit 303 may comprise an LC-VCO 302, a loop filter 308, a charge pump 309, and a phase detector 310 which are all known in the art. In general, during operation, the LC-VCO may be a clock source of the CDR circuit 303 and the LC-VCO 302 may output a voltage based on an input frequency. Also during operation, the loop filter 308 may control a gain of the data stream, and the phase detector 310 may detect a data sequence from a data stream and determine if the data sequence is locked or unlocked with a clock source.

The on-die jitter modulator 301 may superimpose a sine wave (i.e., jitter/error) that may be adjusted in both frequency and amplitude onto a control voltage of the LC-VCO 302, thus forcing jitter into an output of the LC-VCO 302. The on-die jitter modulator 301 may comprise a state machine ("SM") 306, a programmable clock divider 307, a current digital to analog converter ("IDAC") 304, and a modulating charge pump ("MCP") 305.

The SM 306 may determine a control sequence for the MCP 305 by generating p[1:0] and sgn control signals. The p[1:0] control signal may control a magnitude of the MCP's 305 output current. For example, if p0 is set to high, a magnitude of the MCP's 305 output current may be one times a present current (i.e., equal to the present current). If both p0 and p1 are set to high, a magnitude of the output current of the MCP may be equal to twice the present current (i.e., two times the present current). If p0 and p1 are both set to low, a magnitude of the MCP's 305 output current may be equal to zero. The sgn control signal may indicate a sign bit to change a polarity of the MCP's 305 output current to facilitate charging and discharging of one or more capacitors that comprise the MCP 305.

In some embodiments, the MCP 305 may be a 5-state charge pump with one or more predefined output levels. For example, the predefined output levels may include −2, −1, 0, 1 and 2. Providing output levels to the MCP 305 in a continuous sequence may generate a modulating sine wave.

To control a frequency of the modulating sine wave, measured in Hertz, and an amplitude of the modulating sine wave, measured in unit intervals peak to peak (UIpp), a programmable clock divider 307 and 4-bit current digital to analog converter ("IDAC") 304 may be employed.

The programmable clock divider 307 may divide a received clock signal by $2^n$, where n is an integer such as n=1 . . . 9. For example, if a received clock signal is at 800 KHz and the programmable clock divider 307 is set to n=2, then the frequency of a clock signal input into the SM 306 may be based on 800 KHz divided by $2^2$ (i.e., 200 KHz).

The 4-bit current IDAC 304 may determine an amount of the MCP's 305 current amplitude ($I_{MCP}$) that may be applied, which may in turn control the amplitude of the modulated sine wave. In some embodiments, the jitter modulator 301 may be calibrated via a calibration voltage that is input into the jitter modulator 301. Furthermore, if a calibration enable switch is activated, the calibration signal may be input into the loop filter 308.

Figure 4:
FIG. 4 illustrates a process according to some embodiments.

Now referring to FIG. 4, an embodiment of a method 400 is illustrated. The method may be performed by a system, such as, but not limited to, system 200. At 401, a sine wave is generated via a jitter modulator to to be injected into a clock source, the jitter modulator being in-situ on a die. Injecting may comprise modulating a control voltage of a LC-based voltage-controlled oscillator. The jitter modulator, such as on-die jitter modulator 301, may receive a clock signal at a programmable clock divider. The programmable clock divider may alter a frequency of the received clock signal by dividing the frequency of the clock signal by $2^n$, where n is an integer. The programmable clock divider may then transmit the divided clock signal to a SM. In some embodiments, a modulation period may require 64 divided clock periods.

The SM may receive the divided clock signal and output control signals that comprise a control sequence to provide frequency related instructions based on the divided clock signal to an MCP. The MCP may also receive a current from a IDAC that indicates a desired amplitude of the sine wave. Having received both the control signals from the SM and the current from the IDAC, the MCP may generate the sine wave.

At 402 the sine wave is received at a clock and data recovery circuit comprising the clock source, the clock and data recovery circuit being in-situ on the die. The clock source may comprise the LC-based voltage-controlled oscillator. The clock and data recovery circuit may comprise a loop filter where the sine wave may be input into an input of the loop filter. In some embodiments, the received sine wave may comprise a modulated amplitude ranging from 0.02-0.24 UIpp at 94 MHz to 5.2-44 UIpp at 724 KHz.

In order to determine jitter tolerance of the clock and data recovery circuit, the output of the LC-based voltage-controlled oscillator comprising both the sine wave and a conventional output signal is monitored and compared to a conventional output signal from the LC-based voltage-controlled oscillator that does not comprise the sine wave.

Now referring to FIG. 5, an embodiment of a process 500 is illustrated. Process 500 may be executed by a system, such as, but not limited to system 600 of FIG. 6 or an apparatus as described with respect to FIG. 3. At 501 data is received from a transmitter at a receiver comprising a jitter modulator and a clock and data recovery circuit. The received data may comprise a clock signal and non-clock data. As illustrated in FIG. 6, a transmitter 601 may receive a clock signal mixed with non-clock data. Data, including the clock signal, may be transmitted via the transmitter 601 to a receiver 602. The receiver 602 may comprise a CDR circuit 603 and a jitter modulator, as previously described with respect to FIG. 2 and FIG. 3.

At 502, an error may be generated via the jitter modulator, wherein the error comprises a modulated sequence added to an output of the clock and data recovery circuit 603. In some embodiments, the modulated sequence may comprise a modulated sine wave. The CDR circuit 603 may output a signal that is added to a modulated signal to produce a modulated sequence. At 503, the error is injected into the clock and data recovery circuit. As illustrated, the error input into the receiver 602 may be injected into the CDR circuit 603.

The error at the clock and data recovery circuit is repressed at 504 based on detecting a change in an input edge. Repressing may comprise changing a phase of a clock source contained in the clock and data recovery circuit. A clock signal may comprise an input edge such as a rising edge or a falling edge. In some embodiments a clock signal's input edge may be altered by an addition of an error signal (i.e., the edge may be moved) which may cause the clock signal to go out of phase. To repress the error, a phase detector, such as phase detector 310, may alter a frequency of the clock signal (i.e., increased in frequency or lowered in frequency) to adjust to the change in the input edge.

At 505, a clock signal comprising the repressed error is outputted and at 506, an error tolerance is determined by subtracting the received data from the outputted clock signal.

Various modifications and changes may be made to the foregoing embodiments without departing from the broader spirit and scope set forth in the appended claims.

What is claimed is:

1. An apparatus, comprising:
   an integrated circuit die having:
      a clock and data recovery circuit including a clock source; and
      a jitter modulator to inject an error into the clock and data recovery circuit,
   the jitter modulator including a modulating charge pump.

2. The apparatus of claim 1, wherein the clock and data recovery circuit further includes a loop filter, and wherein an output of the modulating charge pump is coupled to an input of the loop filter.

3. The apparatus of claim 1, wherein the modulating charge pump generates a modulated sine wave based on predefined output levels, and wherein a frequency of the modulated sine wave is determined by a clock divider control.

4. The apparatus of claim 3, wherein an amplitude of the modulated sine wave is based on an output of a current digital to analog converter.

5. The apparatus of claim 1, wherein the modulating charge pump receives an output of the state machine, and wherein the state machine receives an output of the programmable clock divider.

6. A method, comprising:
   generating a sine wave via a jitter modulator to be injected into a clock source, the jitter modulator including a modulating charge pump and being in-situ on a die;
   receiving the sine wave at a clock and data recovery circuit that includes the clock source, the clock and data recovery circuit being in-situ on the die.

7. The method of claim 6, wherein an output of the jitter modulator is coupled to an input of a loop filter of the clock and data recovery circuit to input the sine wave.

8. The method of claim 6, wherein the generated sine wave is based on a pre-determined number of output levels and a frequency of the modulated sine wave is determined by a clock divider control that divides a received clock signal by $2^n$, where n is an integer.

9. The method of claim 8, wherein the generated sine wave includes an amplitude based on an output of a current digital to analog converter.

10. The method of claim 6, wherein the modulating charge pump receives an output of a state machine, and wherein the state machine receives an output of a programmable clock divider.

11. The method of claim 6, wherein the clock source includes an inductance-capacitance-based voltage-controlled oscillator.

12. A method, comprising:

receiving data from a transmitter at a receiver having a jitter modulator and a clock and data recovery circuit, the data including a clock signal;

generating an error via the jitter modulator, wherein the error includes a modulated sequence added to an output of the clock and data recovery circuit; and repressing the error at the clock and data recovery circuit based on detecting a change in an input edge, wherein said repressing includes changing a phase of a clock source contained in the clock and data recovery circuit.

13. The method of claim 12, further comprising:

injecting the error into the clock and data recovery circuit; and outputting a clock signal having the repressed error.

14. The method of claim 13, further comprising:

determining an error tolerance by subtracting the received data from the outputted clock signal.

15. An apparatus comprising:

an integrated circuit die having:

a clock and data recovery circuit including a clock source, the clock source including an inductance-capacitance-based voltage-controlled oscillator (LC-VCO); and a jitter modulator to inject an error into the clock and data recovery circuit by modulating a control voltage of the LC-VCO.

\* \* \* \* \*